United States Patent
Li et al.

(10) Patent No.: US 7,718,999 B2
(45) Date of Patent: May 18, 2010

(54) POLYTHIOPHENE ELECTRONIC DEVICES

(75) Inventors: Yuning Li, Mississauga (CA); Beng S. Ong, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 666 days.

(21) Appl. No.: 11/638,726

(22) Filed: Dec. 14, 2006

(65) Prior Publication Data
US 2008/0142788 A1    Jun. 19, 2008

(51) Int. Cl.
H01L 35/24   (2006.01)
H01L 51/00   (2006.01)

(52) U.S. Cl. .............. 257/40; 257/E51.029; 428/690

(58) Field of Classification Search ............ 257/40, 257/E51.029; 428/690
See application file for complete search history.

(56) References Cited

U.S. PATENT DOCUMENTS

| 5,538,666 | A | 7/1996 | Jin |
| 6,770,904 | B2 | 8/2004 | Ong et al. |
| 7,294,850 | B2 * | 11/2007 | Ong et al. ............... 257/40 |
| 2005/0017311 | A1 | 1/2005 | Ong et al. |
| 2006/0124921 | A1 | 6/2006 | Ong et al. |
| 2006/0214155 | A1 | 9/2006 | Ong et al. |

FOREIGN PATENT DOCUMENTS

| EP | 0 203 438 | 12/1986 |
| EP | 0 459 255 | 12/1991 |
| EP | 1 329 476 | 7/2003 |
| JP | 07 268083 | 10/1995 |
| JP | 2006 225461 | 8/2006 |

OTHER PUBLICATIONS

Herrera et al, "Photoemission study of the thermal and photochemical decomposition of a urethane-substituted polythiophene," Synthetic Metals 128 (2002) 317-324.*
Czerwinski et al, "Ozonization of electronic conducting polymers I. Copolymers based on poly[3-nonylthiophene]," Polymer Degradation and Stability 80 (2003) 93-101.*
Holland et al, "Effects of order and disorder on field-effect mobilities measured in conjugated polymer thin-film transistors," J. Appl. Phys. 75 (12), Jun. 15, 1994, pp. 7954-7957.*
Herrera, G.J.; Whitten, J.E., "Photoemission study of the thermal and photochemical decomposition of a urethane-substituted polythiophene", Synthetic Metals, vol. 128, No. 3, pp. 317-324, May 10, 2002; Elsevier Sequoia, Lausanne, CH.

(Continued)

Primary Examiner—Kenneth A Parker
Assistant Examiner—Anthony Ho
(74) Attorney, Agent, or Firm—Fay Sharpe LLP

(57) ABSTRACT

An electronic device with a semiconductor layer of (I)

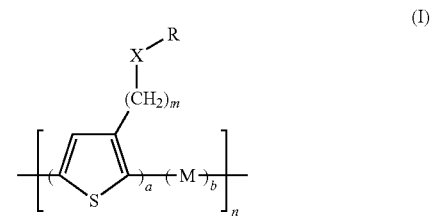

wherein X is O or NR'; m represents the number of methylenes; M is a conjugated moiety; R and R' are selected from the group consisting of at least one of hydrogen, a suitable hydrocarbon, and a suitable hetero-containing group; a represents the number of 3-substituted thiophene units; b represents the number of conjugated moieties, and n represents the number of polymer repeating units.

30 Claims, 2 Drawing Sheets

OTHER PUBLICATIONS

Czerwinski W. et al., "Ozonization of electronic conducting polymers I. Copolymers based on poly[3-nonylthiophene]", Polymer Degradation and Stability, Barking, GB, vol. 80, No. 1, 2003, pp. 93-101.

Murphy, A. et al., "Synthesis, Characterization, and Field-Effect Transistor Performance of Carboxylate-Functionalized Polythiophenes with Increased Air Stability", Chemistry of Materials, Washington, US, vol. 17, No. 20, Sep. 2, 2005, pp. 4892-4899.

Holland E.R. et al., "Effects of order and disorder on field-effect mobilities measured in conjugated polymer thin-film transistors", Journal of Applied Physics, American Institute of Physics, New York, US, vol. 75, No. 12, Jun. 15, 1994, pp. 7954-7957.

See the "Cross Reference to Related Applications" on pp. 1 to 3 of the Specification Being Filed Concurrently .

* cited by examiner

POLYTHIOPHENE ELECTRONIC DEVICES

CROSS REFERENCE TO RELATED APPLICATIONS

Illustrated in copending U.S. application Ser. No. 11/638,725, filed Dec. 14, 2006, the disclosure of which is totally incorporated herein by reference, is an electronic device comprising a semiconductor of Formula/Structure (I)

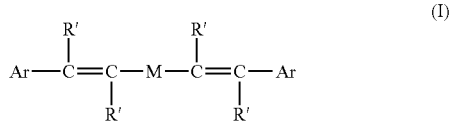

wherein each R' is independently at least one of hydrogen, and a suitable hydrocarbon; Ar is at least one of aryl and heteroaryl; and M represents at least one thiophene based conjugated segment.

U.S. application Ser. No. 11/586,449, filed Oct. 25, 2006 on Electronic Devices by Beng S. Ong et al.

U.S. application Ser. No. 11/586,448, filed Oct. 25, 2006 on Poly(dithienylbenzo[1,2-b:4,5-b']dithiophene) Polymers by Beng S. Ong et al.

U.S. application Ser. No. 11/398,981, filed Apr. 6, 2006 on Functionalized Heteroacenes and Electronic Devices Generated Therefrom by Yuning Li et al.

U.S. application Ser. No. 11/399,226, filed Apr. 6, 2006 on Functionalized Heteroacenes by Yuning Li et al.

U.S. application Ser. No. 11/399,216, filed Apr. 6, 2006 on Polyacenes and Electronic Devices Generated Therefrom by Yuning Li et al.

U.S. application Ser. No. 11/399,064, filed Apr. 6, 2006 on Heteroacene Polymers and Electronic Devices Generated Therefrom by Yuning Li et al.

U.S. application Ser. No. 11/399,169, filed Apr. 6, 2006 on Ethynylene Acene Polymers and Electronic Devices Generated Therefrom by Yuning Li et al.

U.S. application Ser. No. 11/399,091, filed Apr. 6, 2006 on Ethynylene Acene Polymers by Yuning Li et al.

U.S. application Ser. No. 11/399,231, filed Apr. 6, 2006 on Poly[bis(ethynyl)heteroacenes] and Electronic Devices Generated Therefrom by Yuning Li et al.

U.S. application Ser. No. 11/399,141, filed Apr. 6, 2006 on Semiconductors and Electronic Devices Generated Therefrom by Yiliang Wu et al.

U.S. application Ser. No. 11/399,230, filed Apr. 6, 2006 on Semiconductor Polymers by Yiliang Wu et al.

U.S. application Ser. No. 11/398,941, filed Apr. 6, 2006 on Polydiazaacenes and Electronic Devices Generated Therefrom by Yiliang Wu et al.

U.S. application Ser. No. 11/398,902, filed Apr. 6, 2006 on Polydiazaacenes by Yiliang Wu et al.

U.S. application Ser. No. 11/398,931, filed Apr. 6, 2006 on Poly(alkynylthiophene)s and Electronic Devices Generated Therefrom by Beng S. Ong et al.

U.S. application Ser. No. 11/399,246, filed Apr. 6, 2006 on Poly(alkynylthiophene)s by Beng S. Ong et al.

U.S. application Ser. No. 11/399,092, filed Apr. 6, 2006 on Linked Arylamine Polymers and Electronic Devices Generated Therefrom by Yuning Li et al.

U.S. application Ser. No. 11/399,065, filed Apr. 6, 2006 on Linked Arylamine Polymers by Yuning Li et al.

Illustrated in U.S. application Ser. No. 11/011,678, Publication No. 20060124921 filed Dec. 14, 2004, relating to indolocarbazole moieties and thin film transistor devices thereof.

Illustrated in U.S. application Ser. No. 11/167,512, Publication No. 20060214155 filed Jun. 27, 2005, relating to indolocarbazole moieties and thin film transistor devices thereof.

Illustrated in U.S. Pat. No. 6,770,904 and copending application U.S. application Ser. No. 10/922,662, Publication No. 20050017311, are electronic devices, such as thin film transistors containing semiconductor layers of, for example, polythiophenes.

The disclosure of each of the above crossreferenced copending applications are totally incorporated herein by reference. In aspects of the present disclosure, there may be selected the appropriate substituents, such as a suitable hydrocarbon, a heteroatom containing group, hydrogen, halogen, source and gate electrodes, substrates, number of repeating polymer units, number of groups, and the like as illustrated in the copending applications.

BACKGROUND

The present disclosure is generally directed to semiconductors of the formulas/structures as illustrated herein and processes of preparation and uses thereof. More specifically, the present disclosure in embodiments is directed to TFT polymers of the formulas as illustrated herein and more specifically to a number of stabilized polythiophenes wherein there is introduced into the polythiophene atoms of higher electronegativity, such as O (3.44, Pauling's electronegativity), and N (3.04) than C (2.55) at the beta and/or gamma positions of the 3-substituent of the thiophene unit, and which resulting polythiophenes are more stable than poly(3-alkylthiophene)s, such as poly(3-hexylthiophene) (P3HT), and which disclosed polythiophenes can be selected as semiconductors for polymer thin film transistors, and also which can be selected as solution processable and substantially stable channel semiconductors in organic electronic devices, such as thin film transistors, and which transistors are stable in air, that is do not substantially degrade over a period of time when exposed to oxygen. Although not desiring to be limited by theory, it is believed that the inductive effect and insignificant resonance (or mesomeric) effect of atoms like O and N, and that such atoms at the beta and/or gamma positions would have an electron withdrawing characteristic on the polymer backbone that there is lowered the HOMO (highest occupied molecular orbital) energy level of the polythiophene polymer thus resulting in an increased stability against oxygen and in enhancing transistor performance, such as field effect mobility. More specifically, it is believed that although O and N atoms have a larger electronegativity than carbon (C), the net polar effect of the substituents containing O or N, such as OH, OR, is electron release (donating) when they are attached directly to the aromatic moiety of the thiophene primarily because of their electron releasing resonance effect, thus poly (3-alkoxythiophene) is usually more sensitive to photoinduced oxygen doping than poly(3-alkylthiophene). To eliminate or reduce the resonance effect of O and N atoms with the present disclosure, there is inserted, for example, one or two methylene groups between the O or the N and the thiophene moiety since the O and N would not involve the conjugation of the thiophene ring. However, the electron withdrawing inductive effect to the thiophene ring would be still maintained to some extent. The net polar effect of these substituents would be less electron-releasing than alkyl substituents, and thus lower the HOMO energy level of the polymer compared with poly(3-alkylthiophene), therefore an increase in the stability of these polymers towards oxidative doping by oxygen results.

There are desired electronic devices, such as thin film transistors, TFTs, fabricated with a semiconductor of the formulas as illustrated herein, and which semiconductors possess excellent solvent solubility, and which can be solution processable; and which devices possess mechanical durability and structural flexibility, characteristics which are desirable for fabricating flexible TFTs on a number of substrates, such as plastic substrates. Flexible TFTs enable the design of electronic devices with structural flexibility and mechanical durability characteristics. The use of plastic substrates together with the semiconductor of the formulas as illustrated herein can transform the traditionally rigid silicon TFT into a mechanically more durable and structurally flexible TFT design. This can be of particular value to large area devices such as large area image sensors, electronic paper and other display media. Also, the selection of the semiconductors of the formulas as illustrated herein possess in embodiments extended conjugation for integrated circuit logic elements for low end microelectronics, such as smart cards, radio frequency identification (RFID) tags, and memory/storage devices, and enhance their mechanical durability, and thus their useful life span.

A number of semiconductor materials are not, it is believed, stable when exposed to air as they become oxidatively doped by ambient oxygen resulting in increased conductivity. The result is large off current, and thus a low current on/off ratio for the devices fabricated from these materials. Accordingly, with many of these materials, rigorous precautions are usually undertaken during materials processing and device fabrication to exclude environmental oxygen to avoid or minimize oxidative doping. These precautionary measures increase the cost of manufacturing therefore offsetting the appeal of certain semiconductor TFTs as an economical alternative to amorphous silicon technology, particularly for large area devices. These and other disadvantages are avoided or minimized in embodiments of the present disclosure.

REFERENCES

Regioregular poly(3-alkylthiophene)s usually undergo rapid photo oxidative degradation under ambient conditions, while polytriarylamines are known to possess some stability when exposed to air, however, these amines are believed to possess low field effect mobilities. These disadvantages can be avoided or minimized with the polymers of the formulas as illustrated herein.

Also, acenes, such as pentacenes, heteroacenes, and their derivatives are known to possess acceptable high field effect mobility when used as channel semiconductors in TFTs. However, these materials can be rapidly oxidized by, for example, atmospheric oxygen under light, and such compounds are not considered processable at ambient conditions. Furthermore, when selected for TFTs, non-substituted acenes are substantially insoluble, thus they are essentially nonsolution processable; accordingly, such compounds have been processed by vacuum deposition methods that result in high production costs, eliminated or minimized with the TFTs generated with the semiconductors illustrated herein. Although some substituted acenes are soluble in organic solvent, they usually have poor thin film formation characteristics, and thus not suitable for solution processing large area electronics.

A number of organic semiconductor materials has been described for use in field effect TFTs, which materials include organic small molecules, such as pentacene, see for example D. J. Gundlach et al., "Pentacene organic thin film transistors—molecular ordering and mobility", *IEEE Electron Device Lett.*, Vol. 18, p. 87 (1997); oligomers such as sexithiophenes or their variants, see for example reference F. Gamier et al., "Molecular engineering of organic semiconductors: Design of self-assembly properties in conjugated thiophene oligomers", *J. Amer. Chem. Soc.*, Vol. 115, p. 8716 (1993), and poly(3-alkylthiophene), see for example reference Z. Bao et al., "Soluble and processable regioregular poly(3-hexylthiophene) for field-effect thin film transistor application with high mobility", *Appl. Phys. Lett.* Vol. 69, p 4108 (1996). Although organic material based TFTs generally provide lower performance characteristics than their conventional silicon counterparts, such as silicon crystal or polysilicon TFTs, they are nonetheless sufficiently useful for applications in areas where high mobility is not required. These include large area devices, such as image sensors, active matrix liquid crystal displays and low end microelectronics such as smart cards and RFID tags.

TFTs fabricated from p-type semiconductor polymers of the formulas illustrated herein may be functionally and structurally more desirable than conventional silicons and other semiconductors in that they may offer mechanical durability, structural flexibility, and the potential of being able to be incorporated directly, thus avoiding costly vacuum deposition processes, onto the active media of the devices, thus enhancing device compactness for transportability. A number of known small molecule or oligomer-based TFT devices rely on difficult vacuum deposition techniques for fabrication. Vacuum deposition is selected primarily because the materials used are either insoluble, or their solution processing by spin coating, solution casting, or stamp printing does not generally provide uniform thin films.

Further, vacuum deposition may also involve the difficulty of achieving consistent thin film quality for large area format. Polymer TFTs, such as those fabricated from regioregular components of, for example, regioregular poly(3-alkylthiophene)s by solution processes, while offering some mobility, suffer from their propensity towards oxidative doping in air. For practical low cost TFT design, it is therefore of value to have a semiconductor material that is both stable and solution processable, and where its performance is not adversely affected by ambient oxygen, for example TFTs generated with regioregular poly(3-alkylthiophene)s are sensitive to air. The TFTs fabricated from these materials in ambient conditions generally exhibit large off-current, very low current on/off ratios, and their performance characteristics degrade rapidly.

BRIEF DESCRIPTION OF THE DRAWINGS

Illustrated in FIGS. 1 to 4 are various representative embodiments of the present disclosure, and wherein semiconductors of the formulas as illustrated herein are selected as the channel or semiconductor material in thin film transistor (TFT) configurations.

EXEMPLARY EMBODIMENTS

Figure 1:
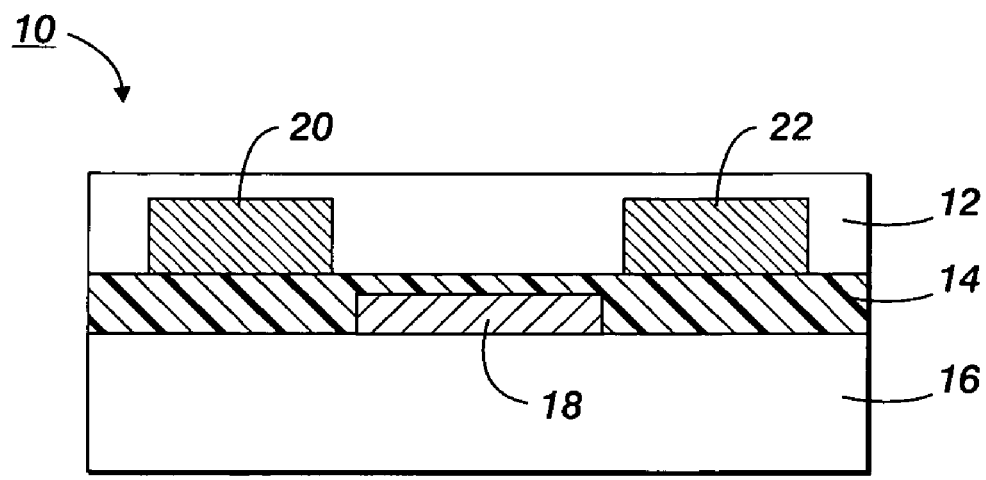

It is a feature of the present disclosure to provide semiconductors of the formulas as illustrated herein, which are useful for microelectronic device applications, such as TFT devices.

It is another feature of the present disclosure to provide semiconductor polymers of the formulas as illustrated herein with a band gap of from about 1.5 eV to about 4 eV as determined from the absorption spectra of thin films thereof.

In yet a further feature of the present disclosure there are provided p-type polymer semiconductors of the formulas illustrated herein which are useful as microelectronic components, and which polymers possess a solubility of, for example, at least about 0.1 percent to about 95 percent by weight in common organic solvents, such as methylene chloride, tetrahydrofuran, toluene, xylene, mesitylene, chlorobenzene, dichlorobenzene, trichlorobenzene, and the like, and thus these polymers can be economically fabricated by solution processes such as spin coating, screen printing, stamp printing, dip coating, solution casting, jet printing, and the like.

Another feature of the present disclosure resides in providing electronic devices, such as TFTs, with p-type polythiophene semiconductors of the formulas as illustrated, and which semiconductors possess, for example, a conductivity of, for example, from about $10^{-4}$ to about $10^{-9}$ S/cm (Siemens/centimeter).

Also, in yet another feature of the present disclosure there are provided novel p-type semiconductors of the formulas as illustrated herein and devices thereof, and which devices exhibit enhanced resistance to the adverse effects of oxygen, that is, these devices exhibit relatively high current on/off ratios, and their performance does not substantially degrade as rapidly as similar devices fabricated with regioregular poly(3-alkylthiophene)s or with acenes.

Additionally, in a further feature of the present disclosure there is provided a class of novel semiconductors of the formulas as illustrated herein with unique structural features which are conducive to molecular self-alignment under appropriate processing conditions, and which structural features also enhance the stability of device performance. Proper molecular alignment can permit higher molecular structural order in thin films, which can be of value to efficient charge carrier transport, and thus higher electrical performance.

There are disclosed in embodiments, polymers, and, more specifically, semiconductors of the formulas as illustrated herein and electronic devices thereof. More specifically, the present disclosure relates to polymers illustrated by or encompassed by Formula/Structure (I)

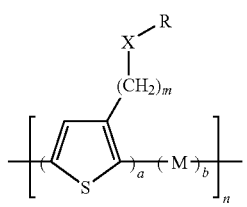

(I)

wherein X is O or NR'; m represents the number of methylenes, and which m can be, for example, 1 or 2; M is a conjugated moiety selected from representative groups as illustrated herein, and wherein R and R' are hydrogen, a suitable hydrocarbon such as alkyl and aryl, hetero-containing groups such as heteroaryls; a represents the number of 3-substituted thiophene units, and can be, for example, from 1 to about 20 (throughout includes all values between the numbers recited); b represents the number of conjugated moieties, and can be, for example, from zero to 20; and n represents the number of repeating units of the polymer, and can be, for example, from 2 to about 5,000, from about 5 to about 2,500, and more specifically, from about 5 to about 1,000, from about 5 to about 800, or from about 5 to about 50.

In embodiments there are disclosed thin film transistors that contain a thiophene of the following formulas/structures

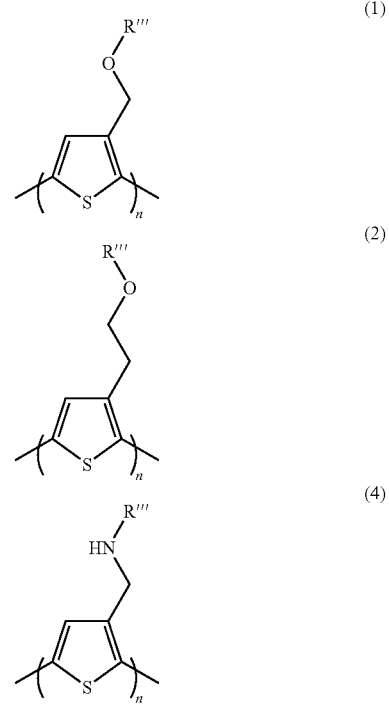

wherein R''' represents alkyl groups of propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, or eicosanyl; n represents the number of repeating units of the polymer, and is, for example, from about 5 to about 1,000 (number values throughout include all numbers therebetween, such as 6, 7, 8, 9, 10, 11, 12, up to 500) from about 10 to about 500, or from about 20 to about 200; the number average molecular weight ($M_n$) of the polythiophene polymers is from about 1,000 to about 200,000, from about 2,000 to about 10,000, or from about 5,000 to about 50,000, and the weight average molecular weight ($M_w$) thereof is from about 1,500 to about 300,000, from about 3,000 to about 150,000, or from about 10,000 to about 100,000, both the $M_w$ and $M_n$ being measured by gel permeation chromatography using polystyrene standards.

Alkyl includes, for example, those substituents with from about 1 to about 35 carbon atoms of, for example, pentyl, hexyl, heptyl, octyl, nonyl, decyl, undecyl, dodecyl, tridecyl, tetradecyl, pentadecyl, hexadecyl, heptadecyl, or octadecyl. Aryl examples are those groups with, for example, from about 6 to about 42 carbon atoms of, for example, phenyl, naphthyl, methylphenyl (tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, and octadecylphenyl.

Examples of M are represented by the following alternative formulas/structures which may or may not be further substituted with one or more of a hydrocarbon group of, for example, alkyl or aryl, hetero-containing groups such as nitro, cyano, heteroaryl such as, for example, thienyl, furanyl, pyridinyl, oxazoyl, pyrroyl, triazinyl, imidazoyl, pyrimidinyl, pyrazinyl, oxadiazoyl, pyrazoyl, triazoyl, thiazoyl, thiadiazoyl, quinolinyl, quinazolinyl, naphthyridinyl, carbazoyl, and substituted derivatives such as 5-methyl-2-thienyl, 3-methyl-2-thienyl, 5-chloro-2-thienyl, 3-chloro-2-thienyl, 5-fluoro-2-thienyl, 3-fluoro-2-thienyl, 5-methyl-2-furanyl, 3-methyl-2-furanyl, 5-chloro-2-furanyl, 3-chloro-2-furanyl, 5-methyl-2-pyridinyl, 5-chloro-2-pyridinyl, N-methyl-5-fluoro-pyrroyl, 6-methyl-3-carbazoyl, 6-chloro-3-carbazoyl, 6-fluoro-3-carbazoyl, mixtures thereof, and the like, or a halogen of fluoro, chloro, bromo, and iodo wherein R″ is hydrogen, a suitable hydrocarbon, such as alkyl and aryl; or a hetero-containing group

M:

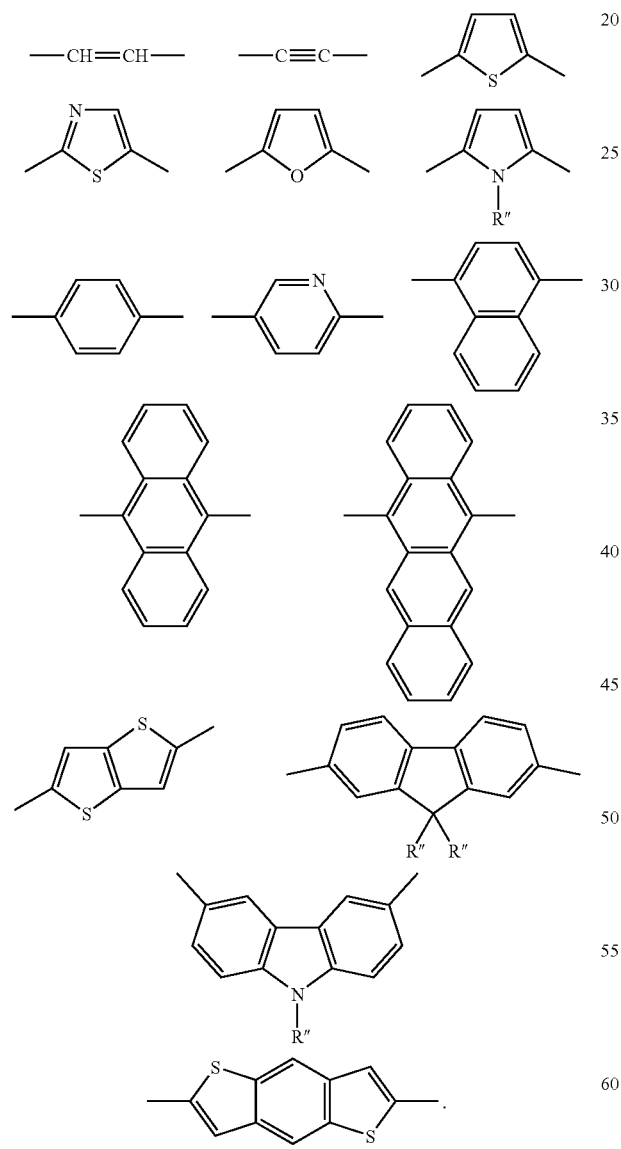

Examples of polythiophenes containing oxygen or nitrogen at the β- or γ-position include, for example, those of the formulas/structures

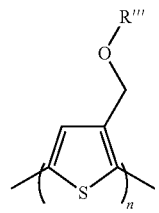   (1)

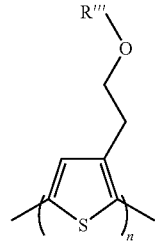   (2)

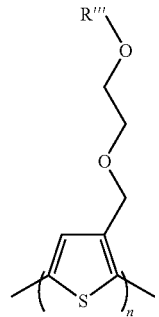   (3)

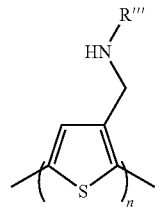   (4)

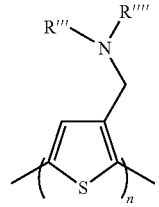   (5)

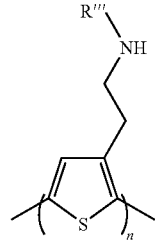   (6)

-continued
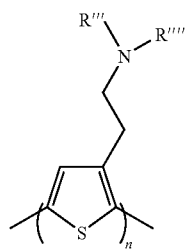
(7)
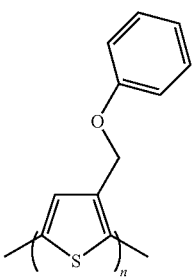
(8)
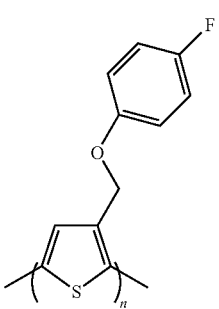
(9)
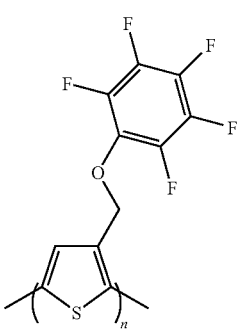
(10)
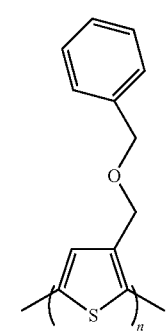
(11)
-continued
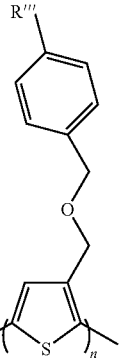
(12)
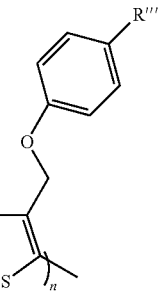
(13)
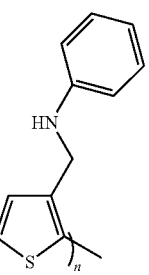
(14)
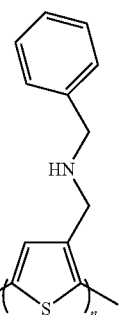
(15)
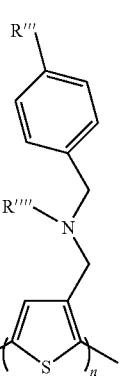
(16)

-continued
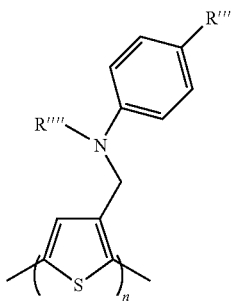
(17)
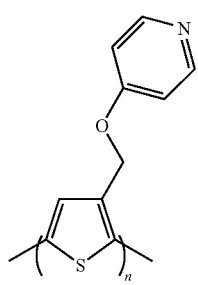
(18)
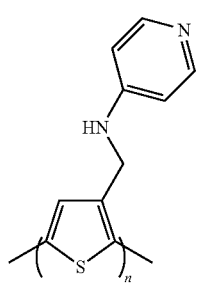
(19)
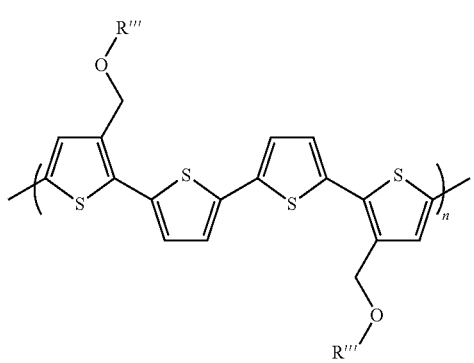
(20)
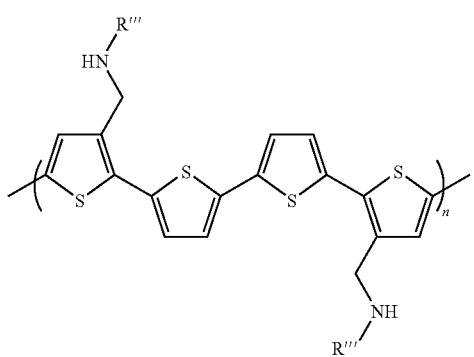
(21)
-continued
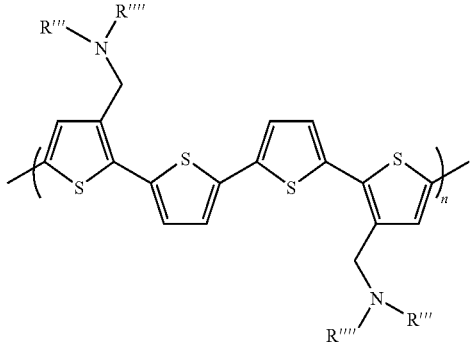
(22)
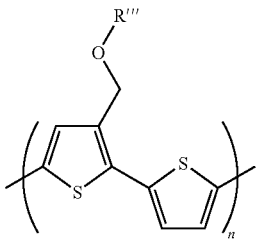
(23)
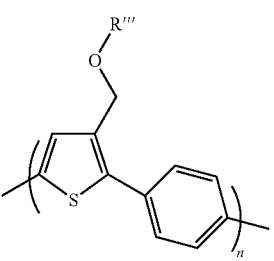
(24)
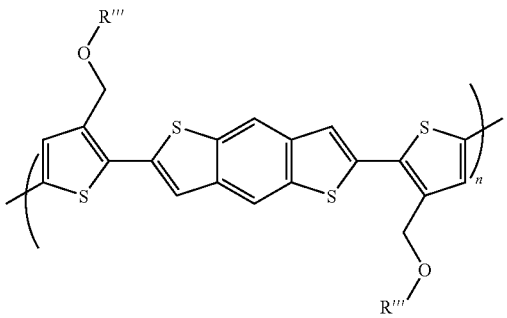
(25)
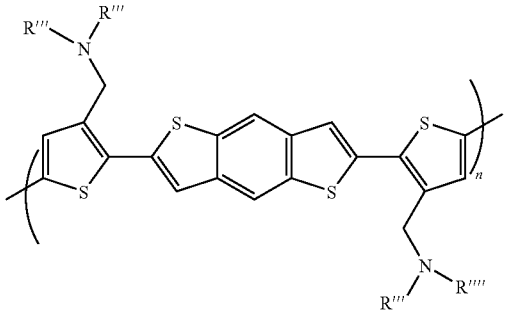
(26)
wherein each R''' or R'''' represents alkyl or substituted alkyl groups with, for example, from about 1 to about 35 carbon atoms of, for example, methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosanyl, hydroxymethyl, hydroxyethyl, hydroxypropyl, hydroxybutyl, hydroxypentyl, hydroxyhexyl, hydroxyheptyl, hydroxyoctyl, hydroxynonyl, hydroxydecyl, hydroxyundecyl, hydroxydodecyl, methoxyethyl, methoxypropyl, methoxybutyl, methoxypentyl, methoxyoctyl, trifluoromethyl, perfluoroethyl, perfluoropropyl, perfluorobutyl, perfluoropentyl, perfluorohexyl, perfluoroheptyl, perfluorooctyl, perfluorononyl, perfluorodecyl, perfluoroundecyl, or perfluorododecyl; n represents the number of repeating units of the polymer, and can be, for example, from 2 to about 5,000, from about 5 to about 2,500, and more specifically, from about 5 to about 1,000, from about 5 to about 800, or from about 5 to about 200. The number average molecular weight ($M_n$) of the polythiophene polymers can be, for example, from about 500 to about 400,000, including from about 1,000 to about 150,000, and the weight average molecular weight ($M_w$) thereof can be from about 600 to about 500,000, including from about 1,500 to about 200,000, both as measured by gel permeation chromatography using polystyrene standards.

The polythiophene polymers of the formulas illustrated herein can be prepared by a number of suitable methods, such as for example the processes as illustrated with reference to the following reaction Scheme 1. More specifically, 3-thiophenemethanol (available from Sigma-Aldrich) is first reacted with sodium hydride (NaH) in anhydrous N,N-dimethylformamide (DMF) to form sodium 3-thiophenemethanolate as an intermediate, followed by addition of 1-bromobutane ($C_4H_9Br$), to form 3-butoxymethylthiophene by nucleophilic substitution. The resulting 3-butoxymethylthiophene is brominated using 1 molar equivalent N-bromosuccinimide (NBS) to generate 2-bromo-3-butoxymethylthiophene. Polymerization of 2-bromo-3-butoxymethylthiophene is conducted by first forming 3-butoxymethyl-2-thienylmagnesium bromide by using i) lithium diisopropylamide (LDA), and ii) magnesium bromide etherate ($MgBr_2.Et_2O$), and then coupling reaction in the presence of a catalytic amount of bis(diphenylphosphino)propane dichloronickel (II) ($Ni(dppp)Cl_2$) to give poly(3-butoxymethylthiophene) (1a). Poly(3-propyloxyethylthiophene), 2a, can be synthesized similarly starting from 3-thiopheneethanol (available from Sigma-Aldrich) and 1-bromopropane ($C_3H_7Br$).

SCHEME 1 Synthesis of Polymers 1a and 2a

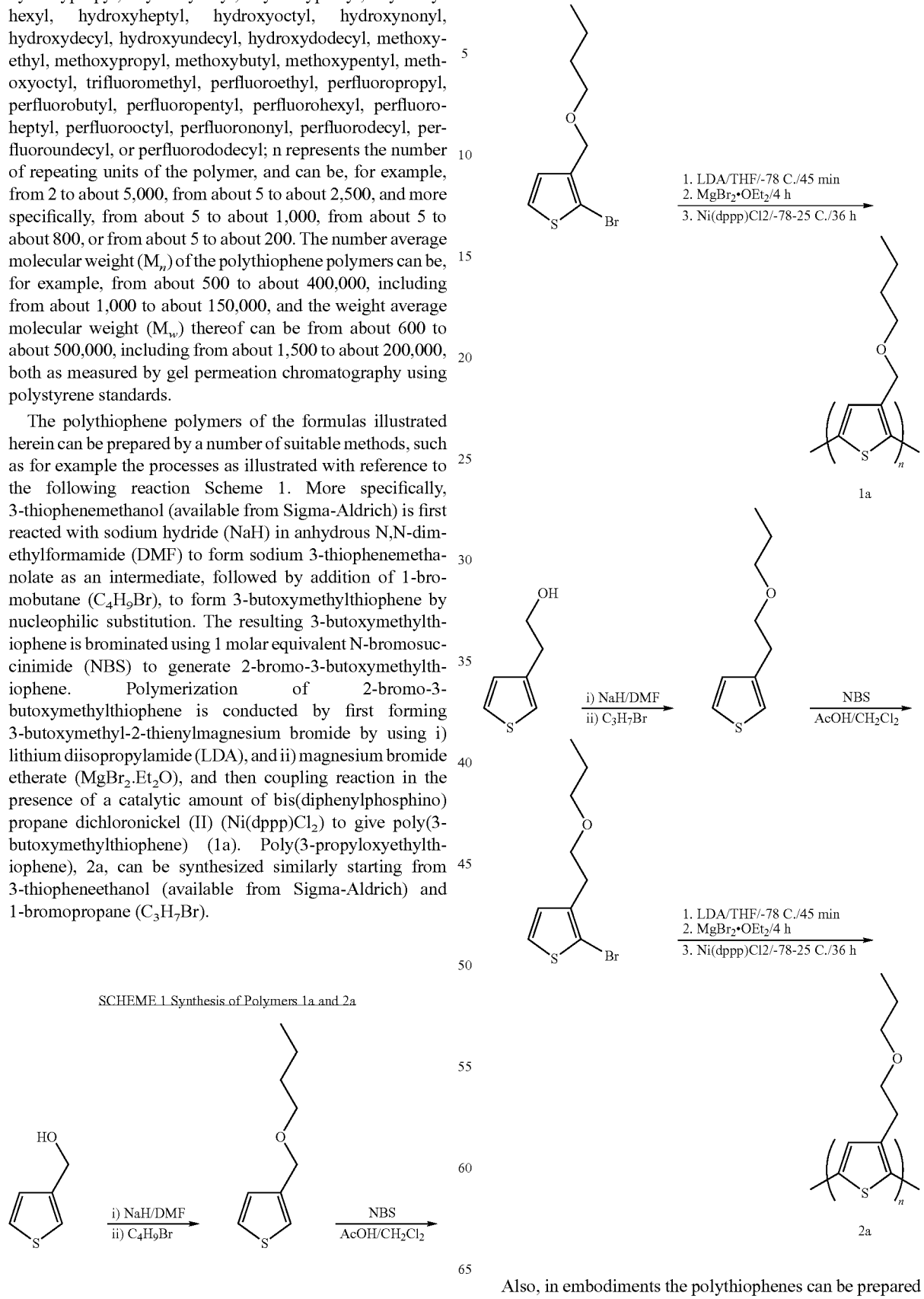

Also, in embodiments the polythiophenes can be prepared similar to the process concepts illustrated in R. D.

McCullough et al., *J. Am. Chem. Soc.* 1993, 119, 11608-11609, the disclosure of which is totally incorporated herein by reference.

The polymer semiconductors of Formula/Structure (I) are soluble or substantially soluble in common coating solvents, for example in embodiments they possess a solubility of at least about 0.1 percent by weight, and more specifically, from about 0.5 percent to about 10 percent, or to about 95 percent by weight in such solvents as methylene chloride, 1,2-dichloroethane, tetrahydrofuran, toluene, xylene, mesitylene, chlorobenzene, dichlorobenzene, and the like. Moreover, p-type semiconductors of the formulas as illustrated herein provide a stable conductivity of, for example, from about $10^{-9}$ S/cm to about $10^{-4}$ S/cm, and more specifically, from about $10^{-8}$ S/cm to about $10^{-5}$ S/cm as determined by conventional four-probe conductivity measurements.

It is believed that the polythiophenes semiconductors of the formulas disclosed when fabricated from solutions, such as thin films of, for example, from about 10 nanometers to about 500 nanometers, or from about 50 to about 300 nanometers in thickness, materials are more stable in ambient conditions than similar devices fabricated from regioregular poly(3-alkylthiophene). When unprotected, the aforementioned p-type semiconductors of the formulas as illustrated herein, and devices thereof are generally stable for a number of days or weeks rather than hours as is the situation with regioregular poly(3-alkylthiophene) after exposure to ambient oxygen, thus the devices fabricated from the semiconductors of the formulas as illustrated herein can provide higher current on/off ratios, and their performance characteristics do not substantially change as rapidly as regioregular poly(3-alkylthiophene) when no rigorous procedural precautions have been taken to exclude ambient oxygen during material preparation, device fabrication, and evaluation.

In further aspects of the present disclosure, there is provided a thin film transistor comprised of a substrate, a gate electrode, a gate dielectric layer, a source electrode, and a drain electrode, and in contact with the source/drain electrodes and the gate dielectric layer a semiconductor layer comprised of the polymers of Formula/Structure (I); an electronic device comprising a semiconductive component, and wherein the device is a thin film transistor, and the component is selected from the group consisting of at least one of the formulas/structures illustrated herein; a TFT device wherein the substrate is a glass sheet, a plastic sheet of a polyester, a polycarbonate, or a polyimide, or a metal sheet such as an aluminum sheet; the gate source and drain electrodes are each independently comprised of gold, silver, nickel, aluminum, copper, platinum, indium titanium oxide, or a conductive polymer, and the gate dielectric is a dielectric layer comprised of silicon nitride or silicon oxide; a TFT device wherein the substrate is a glass, plastic, or metal sheet; the gate, source and drain electrodes are each comprised of gold, and the gate dielectric layer is comprised of the organic polymer poly(methacrylate), or poly(vinyl phenol); a device wherein the semiconductor layer is formed by solution processes of spin coating, stamp printing, screen printing, or jet printing; a device wherein the gate, source, and drain electrodes, the gate dielectric, and semiconductor layers are formed by solution processes of spin coating, solution casting, stamp printing, screen printing, or jet printing; and a TFT device wherein the substrate is a plastic sheet of a polyester, a polycarbonate, or a polyimide, and the gate, source and drain electrodes are fabricated from the organic conductive polymer polystyrene sulfonate-doped poly(3,4-ethylene dioxythiophene), or from a conductive ink/paste compound of a colloidal dispersion of silver in a polymer binder, and the gate dielectric layer is organic polymer or inorganic oxide particle-polymer composite; and thin film transistors thereof.

DESCRIPTION OF THE FIGURES

In FIG. 1 there is schematically illustrated a TFT configuration 10 comprised of a substrate 16, in contact therewith a metal contact 18 (gate electrode), and a layer of an insulating dielectric layer 14 with the gate electrode having a portion thereof or the entire gate in contact with the dielectric layer 14, on top of which layer 14 two metal contacts, 20 and 22 (source and drain electrodes), are deposited. Over and situated between the metal contacts 20 and 22 is layer 12 comprised of the stabilized polythiophene semiconductor, poly (3-butoxymethylthiophene) (1a), of Formula/Structure (I) wherein R is butyl (—$C_4H_9$), and n is 148. The gate electrode can be included in the substrate, in the dielectric layer, and the like throughout.

Figure 2:
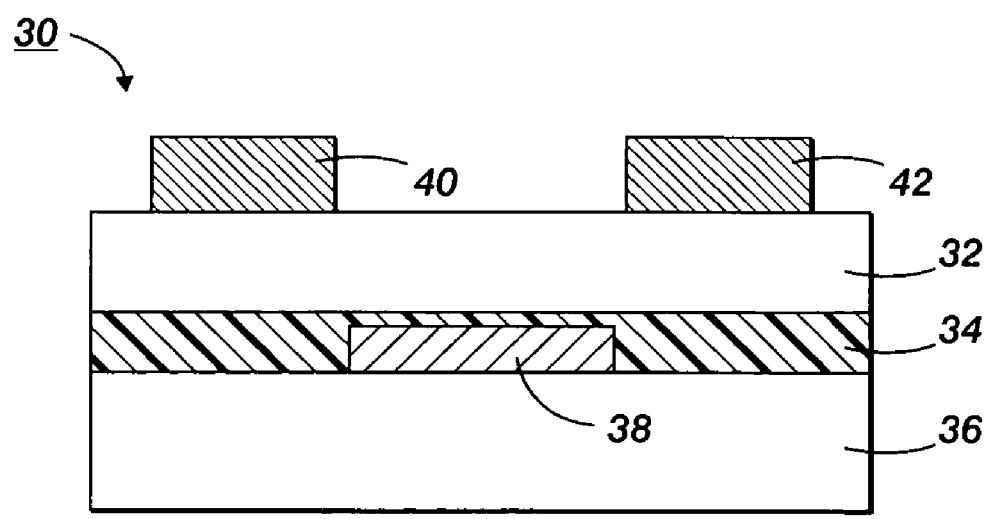

FIG. 2 schematically illustrates another TFT configuration 30 comprised of a substrate 36, a gate electrode 38, a source electrode 40, a drain electrode 42, an insulating dielectric layer 34, and the semiconductor layer 32 of poly(3-butoxymethylthiophene) (1a) of Formulas/Structures (I) wherein R is butyl (—$C_4H_9$), and n is 148.

Figure 3:
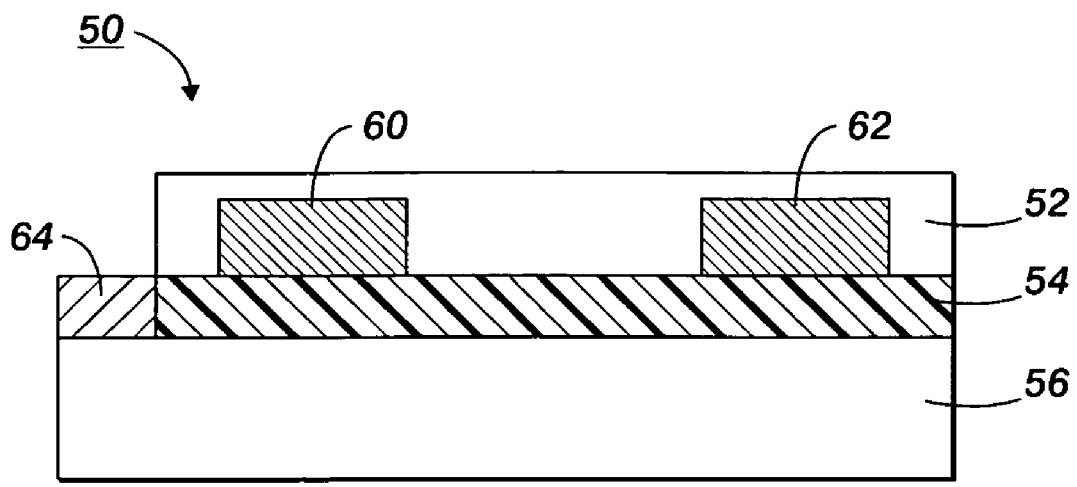

FIG. 3 schematically illustrates a further TFT configuration 50 comprised of a heavily n-doped silicon wafer 56, which can act as a gate electrode, a thermally grown silicon oxide dielectric layer 54, the semiconductor layer 52 of poly (3-butoxymethylthiophene) (1a) on top of which are deposited a source electrode 60 and a drain electrode 62; and a gate electrode contact 64.

Figure 4:
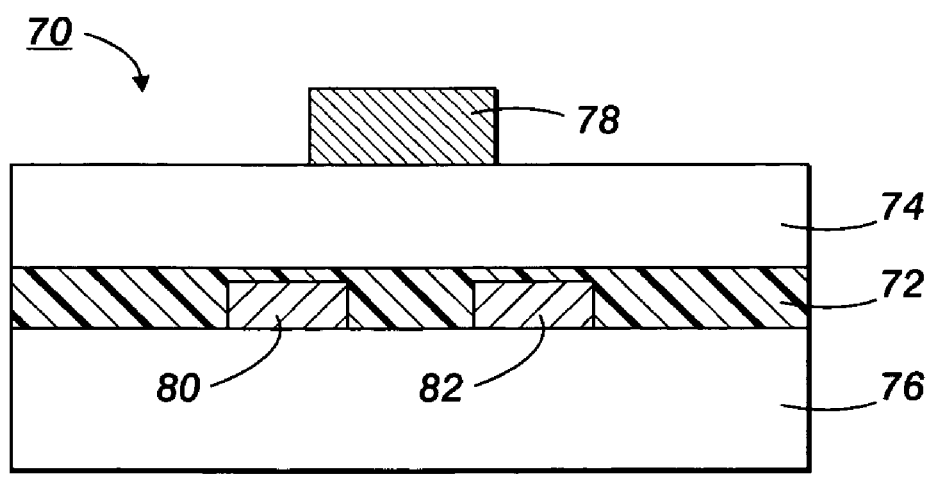

FIG. 4 schematically illustrates a TFT configuration 70 comprised of substrate 76, a gate electrode 78, a source electrode 80, a drain electrode 82, p-type semiconductor of the formulas as illustrated herein, and more specifically, semiconductor layer 72 is comprised of poly(3-butoxymethylthiophene) (1a) wherein n is 148, and an insulating dielectric layer 74.

Also, other devices not disclosed, especially TFT devices, are envisioned, reference for example known TFT devices.

In some embodiments of the present disclosure, an optional protecting layer may be incorporated on top of each of the transistor configurations of FIGS. 1, 2, 3 and 4. For the TFT configuration of FIG. 4, the insulating dielectric layer 74 may also function as a protecting layer.

In embodiments and with further reference to the present disclosure and the Figures, the substrate layer may generally be a silicon material inclusive of various appropriate forms of silicon, a glass plate, a plastic film or a sheet, a metal sheet, and the like depending on the intended applications. For structurally flexible devices, a plastic substrate, such as for example polyester, polycarbonate, polyimide sheets, or a metal sheet, such as an aluminum sheet, and the like, may be selected. The thickness of the substrate may be, for example, from about 10 micrometers to over 10 millimeters with a specific thickness being from about 50 to about 100 micrometers, especially for a flexible plastic substrate, and from about 1 to about 10 millimeters for a rigid substrate such as glass or silicon.

The insulating dielectric layer, which can separate the gate electrode from the source and drain electrodes, and is in contact with the semiconductor layer, can generally be an inorganic material film, an organic polymer film, or an organic-inorganic composite film. The thickness of the dielectric layer is, for example, from about 10 nanometers to about 5 micrometers with a more specific thickness being about 100 nanometers to about 1,000 nanometers. Illustrative examples of inorganic materials suitable as the dielectric layer include silicon oxide, silicon nitride, aluminum oxide, barium titanate, barium zirconate titanate, and the like; illustrative examples of organic polymers for the dielectric layer include polyesters, polycarbonates, poly(vinyl phenol), polyimides, polystyrene, poly(methacrylate)s, poly(acrylate)s, epoxy resin, and the like; and illustrative examples of inorganic-organic composite materials include nanosized metal oxide particles dispersed in polymers, such as polyester, polyimide, epoxy resin, and the like. The insulating dielectric layer is generally of a thickness of from about 50 nanometers to about 500 nanometers depending on the dielectric constant of the dielectric material used. More specifically, the dielectric material has a dielectric constant of, for example, at least about 3, thus a suitable dielectric thickness of about 300 nanometers can provide a desirable capacitance, for example, of about $10^{-9}$ to about $10^{-7}$ F/cm$^2$.

Situated, for example, between and in contact with the dielectric layer and the source/drain electrodes is the active semiconductor layer comprised of p-type semiconductors of the formulas as illustrated herein, and wherein the thickness of this layer is generally, for example, about 10 nanometers to about 1 micrometer, or about 40 to about 100 nanometers. This layer can generally be fabricated by solution processes such as spin coating, casting, screen, stamp, or jet printing of a solution of p-type semiconductors of the present disclosure.

The gate electrode can be a thin metal film, a conducting polymer film, a conducting film generated from a conducting ink or paste, or the substrate itself (for example heavily doped silicon). Examples of gate electrode materials include, but are not limited to aluminum, gold, silver, copper, nickel, chromium, indium tin oxide, conducting polymers, such as polystyrene sulfonate-doped poly(3,4-ethylenedioxythiophene) (PSS/PEDOT), a conducting ink/paste comprised of carbon black/graphite or colloidal silver dispersion contained in a polymer binder, such as ELECTRODAG® available from Acheson Colloids Company, and silver filled electrically conductive thermoplastic ink available from Noelle Industries, and the like. The gate layer can be prepared by vacuum evaporation, sputtering of metals or conductive metal oxides, coating from conducting polymer solutions or conducting inks or dispersions by spin coating, casting or printing. The thickness of the gate electrode layer is, for example, from about 10 nanometers to about 10 micrometers, and a specific thickness is, for example, from about 10 to about 200 nanometers for metal films, and about 1 to about 10 micrometers for polymer conductors.

The source and drain electrode layer can be fabricated from materials which provide a low resistance ohmic contact to the semiconductor layer. Typical materials suitable for use as source and drain electrodes include those of the gate electrode materials such as gold, silver, nickel, aluminum, platinum, conducting polymers, and conducting inks. A typical thickness for this layer is, for example, from about 40 nanometers to about 1 micrometer, and more specifically, from about 100 to about 400 nanometers. The TFT devices contain a semiconductor channel with a width W and length L. The semiconductor channel width may be, for example, from about 10 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volt to about −80 volts is applied to the drain electrode to collect the charge carriers transported across the semiconductor channel when a voltage of generally, for example, about +10 volts to about −80 volts is applied to the gate electrode.

Disclosed is an electronic device comprising a semiconductor of the Formula/Structure (I)

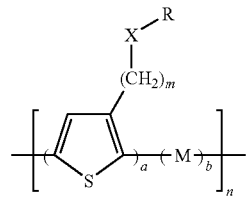

wherein X is one of O or NR'; m represents the number of methylenes; M is a conjugated moiety; R and R' are selected from the group consisting of at least one of hydrogen, a suitable hydrocarbon, and a suitable hetero-containing group; a represents the number of thiophene units; b represents the number of conjugated moieties; and n represents the number of repeating units of the polymer; and a thin film transistor comprised of a supporting substrate, a gate electrode, a gate dielectric layer, a source electrode, and a drain electrode, and in contact with the source/drain electrodes and the gate dielectric layer a semiconductor layer comprised of a polythiophene polymer selected from those of Formula/Structure (I)

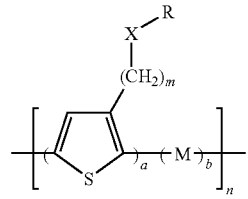

wherein X is O or NR'; m represents the number of methylenes; M is a conjugated moiety; R and R' are hydrogen, a suitable hydrocarbon, and a suitable hetero-containing group, or mixtures thereof; a represents the number of thiophene units; b represents the number of conjugated moieties, and n represents the number of polymer repeating units.

A number of known materials not specifically recited herein for the various components of the TFT devices of the present disclosure can also be selected in embodiments.

The following Examples are provided:

Example I

Synthesis of Poly(3-butoxymethylthiophene)

1) 3-Butoxymethylthiophene

To a stirred suspension of sodium hydride (NaH) (2.63 grams, 66 mmol, 60 percent dispersion in oil) in anhydrous N,N-dimethylformamide (DMF) (15 milliliters) was added dropwise a solution of 3-thiophenemethanol (5.105 grams, 43.8 mmol) in DMF (15 milliliters). The reaction mixture was stirred until the evolution of hydrogen ceased (about 0.5 hour). To the resulting suspension, 1-bromobutane (10.3 grams, 75 mmol) in DMF (15 milliliters) was added dropwise and then stirred at room temperature for 4 hours. The reaction mixture was poured into water (200 milliliters) and extracted with ether/hexane (v/v, 100 milliliters/100 milliliters), and washed with brine. The resulting organic layer was dried over magnesium sulfate (MgSO$_4$) and filtered. After removing the DMF solvent, a light yellow liquid was obtained, which was subjected to column chromatography on a silica gel using first hexane (about 400 milliliters to remove mineral oil), and then hexane/CH$_2$Cl$_2$(dichloromethane) (v/v=1/1; 1,200 milliliters). After evaporating the solvents, a colorless liquid was obtained.

Yield: 6.17 grams (81 percent).

$^1$H NMR (in CDCl$_3$): 7.29 (dd, J$_1$=4.9 Hz, J$_2$=3.0 Hz, 1 H), 7.20 (m, 1 H), 7.07 (dd, J$_1$=4.9 Hz, J$_2$=1.3 Hz, 1 H), 4.50 (s, 2 H), 3.46 (t, J=6.6 Hz, 2 H), 1.60 (m, 2 H), 1.40 (m, 2 H), 0.91 (t, J=7.3 Hz, 3 H) ppm.

2) 2-Bromo-3-butoxymethylthiophene

3-Butoxymethylthiophene (6.17 grams, 36.24 mmol) was dissolved in 100 milliliters of CH$_2$Cl$_2$, and then 100 milliliters of acetic acid (AcOH) were added. N-Bromosuccinimide (NBS) (6.45 grams, 36.24 mmol) was then added in portions to the resulting mixture under stirring. The mixture resulting was then stirred at room temperature, about 23° C. to about 27° C., for 24 hours. Reaction completion was determined by $^1$H NMR. The solvents were then removed by evacuation. The residue remaining was dissolved in hexane, and the soluble part was passed through a short silica gel column (10 centimeters×3 centimeters). After removing the solvent, the resulting colorless liquid was purified by column chromatography using hexane/CH$_2$CI$_2$ (3/2, v/v) then by distillation under reduced pressure.

Yield: 6.75 grams (74.8 percent).

$^1$H NMR (in CDCl$_3$): 7.24 (d, J=5.6 Hz, 1 H), 6.98 (d, J=5.6 Hz, 1 H), 4.44 (s, 2 H), 3.46 (t, J=6.5 Hz, 2 H), 1.59 (m, 2 H), 1.40 (m, 2 H), 0.91 (t, J=7.3 Hz, 3 H) ppm.

3) Poly(3-butoxymethylthiophene)

To a well dried 3-neck flask was added 2-bromo-3-butoxymethylthiophene (2.2425 grams, 9 mmol) and dry tetrahydrofuran (THF) (60 milliliters), and the mixture was cooled to −78° C. Lithium diisopropylamide (LDA) (5 milliliters, 1.8 M in THF/heptane/ethylbenzene, Sigma-Aldrich) was then added dropwise to the above mixture followed by stirring for 45 minutes (the solution changed in color from a light yellow to red). Magnesium bromide etherate (MgBr$_2$.Et$_2$O) (2.324 grams, 9 mmol) was then added to the solution. After 4 hours, 24.4 milligrams (0.045 mmol) of bis(diphenylphosphino)propane dichloronickel (II) (Ni(dppp)Cl$_2$) were added, and the mixture was allowed to warm at room temperature. After 2 hours, an additional 24.4 milligrams (0.045 mmol) of bis(diphenylphosphino)propane dichloronickel (II) were added, and the resulting mixture was stirred for 24 hours at room temperature. The solution obtained was then added dropwise to methanol (200 milliliters) to provide a red precipitate. The solids were then purified by Sohxlet extraction with methanol (24 hours), heptane (24 hours), and then the solids obtained were dissolved with chlorobenzene. After removing the solvent, the concentrated solution resulting was added dropwise to methanol (200 milliliters), and the precipitate was filtered. Drying in vacuo provided a red solid of poly(3-butoxymethylthiophene).

Yield: 1.01 gram (67 percent)

$^1$H NMR (in CDCl$_3$): 7.24 (s, 1 H), 4.59 (s, 2 H), 3.58 (m, 2 H), 1.67 (m, 2 H), 1.44 (m, 2 H), 0.96 (m, 3 H) ppm.

GPC (gel permeation chromatography): M$_w$/M$_n$=38,021/24,880=1.54 (polystyrene standards; tetrahydrofuran as eluent)

Melting points measured by DSC (differential scanning calorimetry): 160° C. and 225° C.

UV-vis: λ$_{max}$=449 nanometers (in chlorobenzene); 482 nanometers (thin films).

Device Fabrication and Evaluation:

There was selected a top-contact thin film transistor configuration as schematically illustrated, for example, in FIG. 3. The test device was comprised of an n-doped silicon wafer with a thermally grown silicon oxide layer of a thickness of about 110 nanometers thereon. The wafer functioned as the gate electrode while the silicon oxide layer acted as the gate dielectric; the silicon oxide layer had a capacitance of about 30 nF/cm$^2$ (nanofarads/square centimeter) as measured with a capacitor meter. The silicon wafer was first cleaned with isopropanol, and an argon plasma, and then air dried. Then the clean substrate was immersed in a 0.1 M solution of octyltrichlorosilane (OTS8) in toluene at 60° C. for 20 minutes. Subsequently, the wafer was washed with toluene, isopropanol, and air dried. Poly(3-butoxymethylthiophene) (1a) dissolved in dichlorobenzene at a concentration of 0.3 percent by weight was used to deposit the semiconductor layer. The solution was first filtrated through a 1 micrometer syringe filter, and then spin coated on to the OTS8-treated silicon substrate at 1,000 rpm for 120 seconds at room temperature, resulting in thin film with a thickness of about 20 to about 50 nanometers. After being dried in vacuum oven at 80° C. for 5 to 10 hours, gold source and drain electrodes of about 50 nanometers in thickness for each were deposited on top of the semiconductor layer by vacuum deposition through a shadow mask with various channel lengths and widths, thus creating a series of transistors of various dimensions.

The evaluation of field-effect transistor performance was accomplished in a black box (that is, a closed box which excluded ambient light) at ambient conditions using a Keithley 4200 SCS semiconductor characterization system. The carrier mobility, μ, was calculated from the data in the saturated regime (gate voltage, V$_G$<source-drain voltage, V$_{SD}$) according to equation (1)

$$I_{SD}=C_i\mu(W/2L)(V_G-V_T)^2 \qquad (1)$$

where I$_{SD}$ is the drain current at the saturated regime, W and L are, respectively, the semiconductor channel width and length, C$_i$ is the capacitance per unit area of the gate dielectric layer, and V$_G$ and V$_T$ are, respectively, the gate voltage and threshold voltage. V$_T$ of the device was determined from the relationship between the square root of I$_{SD}$ at the saturated regime, and V$_G$ of the device by extrapolating the measured data to I$_{SD}$=0.

Another property of field-effect transistor is its current on/off ratio. This is the ratio of the saturation source-drain current at the accumulation regime to the source-drain current at the depletion regime.

The transfer and output characteristics of the devices revealed that poly(3-butoxymethylthiophene) (1a) is a p-type semiconductor. Using transistors with a dimension of W=5,000 μm and L=90 μm, the following average properties from at least five transistors were obtained:

Mobility: 10$^{-3}$ cm$^2$/V.s

Current on/off: 10$^5$

TFTs using commercially available regioregular poly(3-hexylthiophene) (Sigma-Aldrich) as the semiconductor layer were fabricated by repeating the above processes and under the same conditions, resulting in device performance as follows.

Mobility: $10^{-4}$ cm$^2$/V.s
Current on/off: 2

The above TFT results indicate that poly(3-butoxymethylthiophene), (1a), had improved air stability towards ambient oxygen compared with regioregular poly(3-hexylthiophene).

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others. Unless specifically recited in a claim, steps or components of claims should not be implied or imported from the specification or any other claims as to any particular order, number, position, size, shape, angle, color, or material.

What is claimed is:

1. An electronic device comprising a semiconductor of the Formula (I):

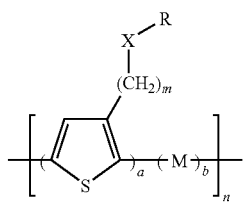

wherein X is one of O or NR'; m is from 1 to about 2; M is a conjugated moiety; a is a number from 1 to about 20; b represents the number of conjugated moieties; n represents the number of repeating units of the polymer; and wherein R and R' are independently selected from the group consisting of hydrogen, alkyl, substituted alkyl, aryl, substituted aryl, benzyl, heteroaryl, and substituted heteroaryl.

2. A device in accordance with claim 1 wherein said n represents a number of from about 2 to about 5,000; and said b is from zero (0) to about 20.

3. A device in accordance with claim 1 wherein said n represents a number of from about 5 to about 1,000; said m represents a number of 1 or 2; said a is a number of from 1 to about 10; and said b is a number of from zero (0) to about 10.

4. A device in accordance with claim 1 wherein said n represents a number of from 5 to about 500; said m is 1; said a is from 1 to about 5; said b is from 0 to about 7, and said X is an oxygen atom (O).

5. A device in accordance with claim 1 wherein the alkyl has from 1 to about 25 carbon atoms.

6. A device in accordance with claim 1 wherein the aryl has from 6 to about 42 carbon atoms.

7. A device in accordance with claim 1 wherein the aryl is phenyl, naphthyl, or phenyl substituted with $C_{1-18}$ alkyl.

8. A device in accordance with claim 1 wherein the heteroaryl is thienyl, furanyl, pyridinyl, oxazoyl, pyrroyl, triazinyl, imidazoyl, pyrimidinyl, pyrazinyl, oxadiazoyl, pyrazoyl, triazoyl, thiazoyl, thiadiazoyl, quinolinyl, quinazolinyl, naphthyridinyl, or carbazoyl.

9. A device in accordance with claim 1 wherein said n is from 5 to about 200; said a is 1; said b is zero, 1, or 2; and said R is $C_{1-20}$ alkyl, $C_{1-12}$ hydroxyalkyl, or $C_{1-12}$ perfluoroalkyl.

10. A device in accordance with claim 1 wherein said conjugated moiety M is a moiety selected from the group consisting of

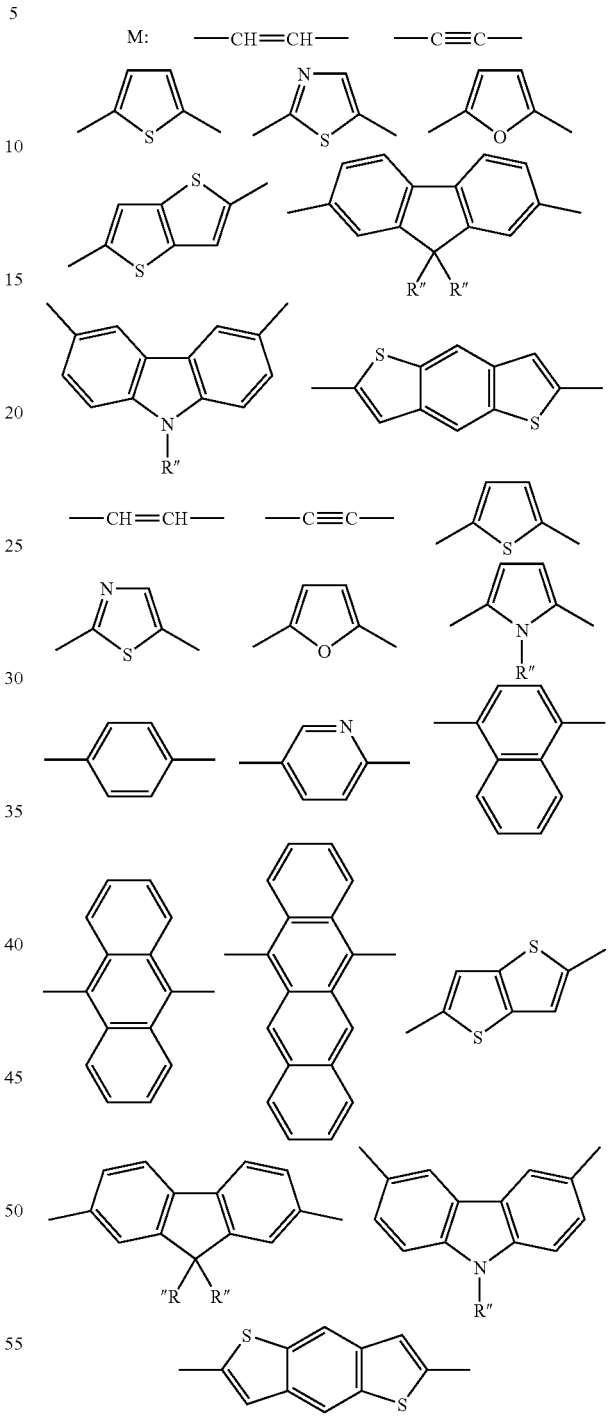

and wherein R" is at least one of hydrogen, alkyl, aryl, and heteroaryl.

11. A device in accordance with claim 10 wherein R" is alkyl containing from about 1 to about 25 carbon atoms or aryl containing from 6 to about 42 carbon atoms.

12. A device in accordance with claim 10 wherein R" is heteroaryl selected from the group consisting of thienyl, furanyl, pyridinyl, oxazoyl, pyrroyl, triazinyl, imidazoyl, pyrimidinyl, pyrazinyl, oxadiazoyl, pyrazoyl, triazoyl, thiazoyl, thiadiazoyl, quinolinyl, quinazolinyl, naphthyridinyl, or carbazoyl.

13. A device in accordance with claim 1 wherein said conjugated moiety is selected from the group consisting of

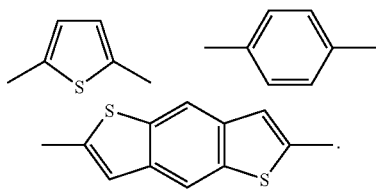

14. A device in accordance with claim 1 wherein the alkyl has 3 to 12 carbon atoms; the substituted aryl is phenyl having a C1-C4 alkyl substituent; the substituted heteroaryl is 5-methyl-2-thienyl, 3-methyl-2-thienyl, 5-chloro-2-thienyl, 3-chloro-2-thienyl, 5-fluoro-2-thienyl, 3-fluoro-2-thienyl, 5-methyl-2-furanyl, 3-methyl-2-furanyl, 5-chloro-2-furanyl, 3-chloro-2-furanyl, 5-methyl-2-pyridinyl, 5-chloro-2-pyridinyl, N-methyl-5-fluoro-pyrroyl, 6-methyl-3-carbazoyl, 6-chloro-3-carbazoyl, or 6-fluoro-3-carbazoyl; and said M is at least one of

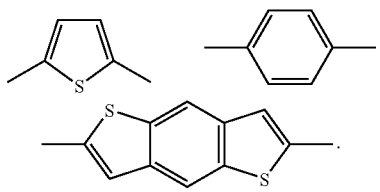

15. A device according to claim 1, wherein R and R' are independently selected from the group consisting of hydrogen; $C_{1-20}$ alkyl; $C_{1-12}$ hydroxyalkyl; $C_{1-12}$ perfluoroalkyl; benzyl; aryl; and aryl substituted with $C_{1-20}$ alkyl, $C_{1-12}$ hydroxyalkyl, or $C_{1-12}$ perfluoroalkyl.

16. A thin film transistor comprised of a substrate, a gate electrode, a gate dielectric layer, a source electrode and a drain electrode, and in contact with the source/drain electrodes and the gate dielectric layer a semiconductor layer comprised of a polymer of Formula (I):

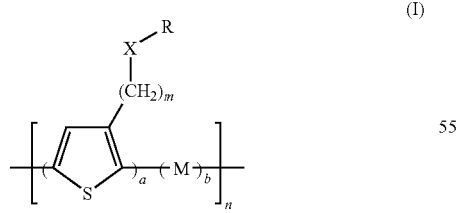

wherein X is O or NR'; m is from 1 to about 2; M is a conjugated moiety; a is from 1 to about 20; n represents the number of polymer repeating units; and wherein R and R' are independently selected from the group consisting of hydrogen, alkyl, substituted alkyl, aryl, substituted aryl, benzyl, heteroaryl, and substituted heteroaryl.

17. A thin film transistor in accordance with claim 16 wherein said n represents a number of from about 2 to about 5,000; and said b is from zero (0) to about 20.

18. A thin film transistor in accordance with claim 16 wherein said n represents a number of from about 5 to about 1,000; said m represents a number of 1 or 2; said a is from 1 to about 10; and said b is from 0 to about 10.

19. A thin film transistor in accordance with claim 16 wherein said n represents a number of from 2 to about 500; said m is 1; said a is from 1 to about 5; said b is from 0 to about 7, and said X is an oxygen atom.

20. A thin film transistor in accordance with claim 16 wherein the alkyl has from 1 to about 25 carbon atoms, and the aryl has from 6 to about 42 carbon atoms.

21. A thin film transistor in accordance with claim 16 wherein said heteroaryl is thienyl, furanyl, pyridinyl, oxazoyl, pyrroyl, triazinyl, imidazoyl, pyrimidinyl, pyrazinyl, oxadiazoyl, pyrazoyl, triazoyl, thiazoyl, thiadiazoyl, quinolinyl, quinazolinyl, naphthyridinyl, or carbazoyl; and the aryl is phenyl or naphthyl; and the substituted aryl is phenyl substituted with $C_{1-18}$ alkyl.

22. A thin film transistor in accordance with claim 16 wherein said X is O or NH; said n is from 5 to about 500; said a is 1; said b is zero, 1, or 2; said R is $C_{1-20}$ alkyl, $C_{1-12}$ hydroxyalkyl, or $C_{1-12}$ perfluoroalkyl; and said R' is hydrogen, $C_{1-20}$ alkyl, $C_{1-12}$ hydroxyalkyl, or $C_{1-12}$ perfluoroalkyl.

23. A thin film transistor in accordance with claim 16 wherein said conjugated moiety, M, is selected from one of the following moieties:

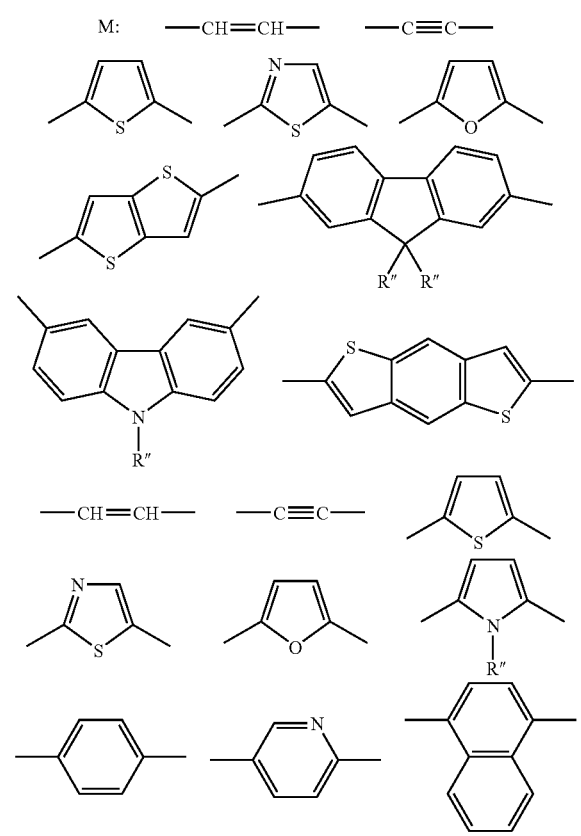

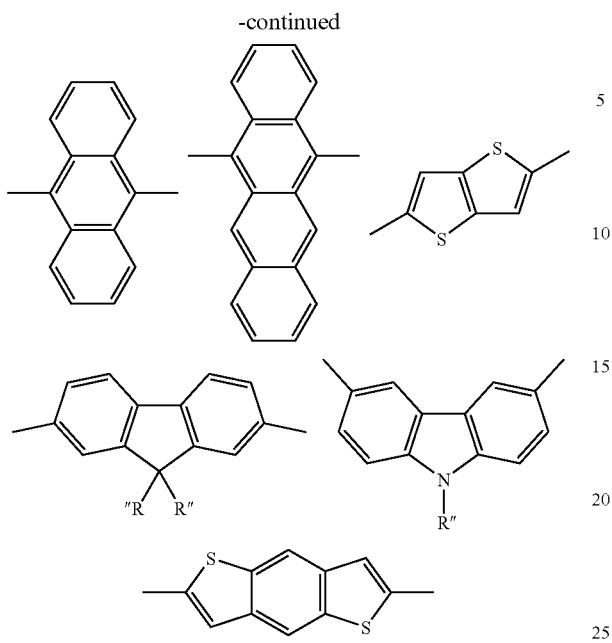
and wherein R'' is at least one of hydrogen, alkyl, aryl, and heteroaryl.
24. A thin film transistor in accordance with claim 23 wherein R'' is $C_{1-20}$.
25. A thin film transistor in accordance with claim 16 said semiconductor polymer is selected from the group consisting of Structures (1), (2), and (4)-(26):
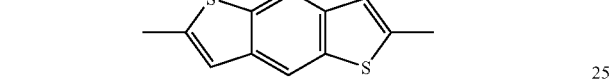
(1)
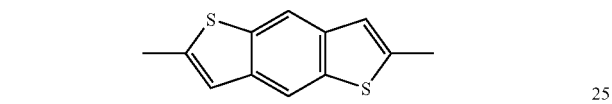
(2)
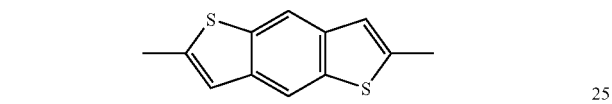
(4)
(5)
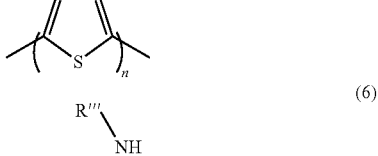
(6)
(7)
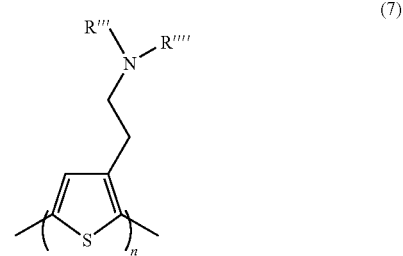
(8)
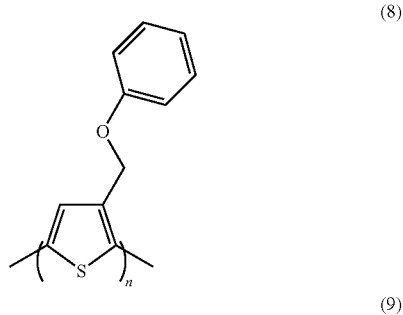
(9)
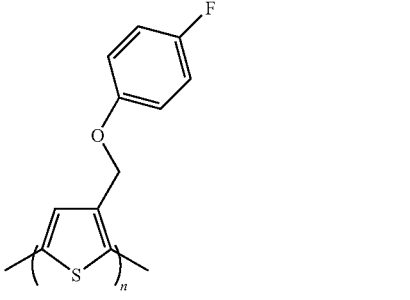
(10)

-continued
(11)
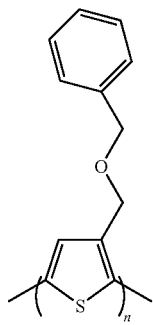
(12)
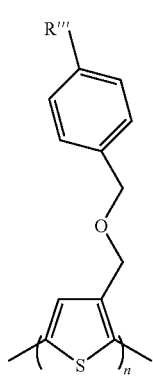
(13)
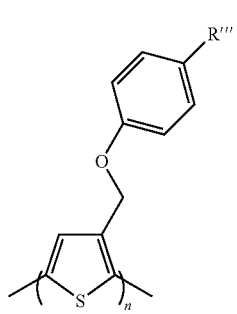
(14)
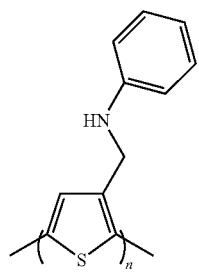
(15)
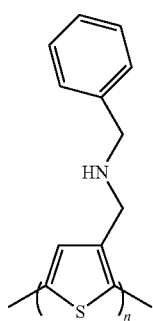
(16)
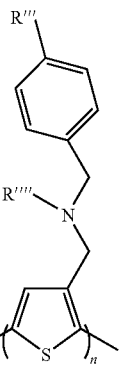
(17)
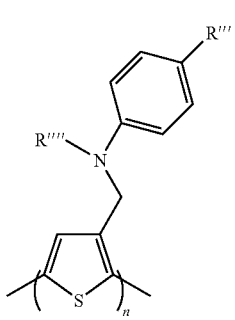
(18)
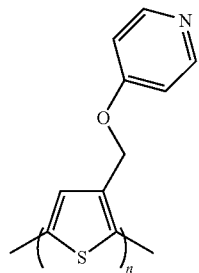
(19)
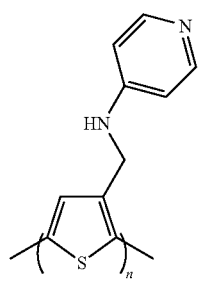
(20)
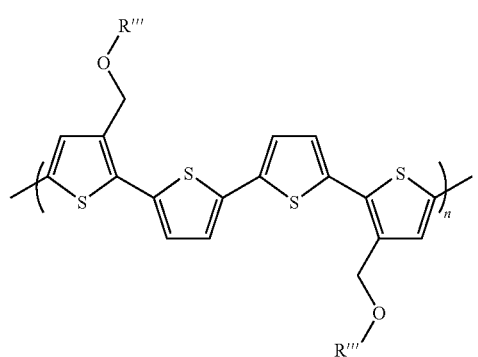

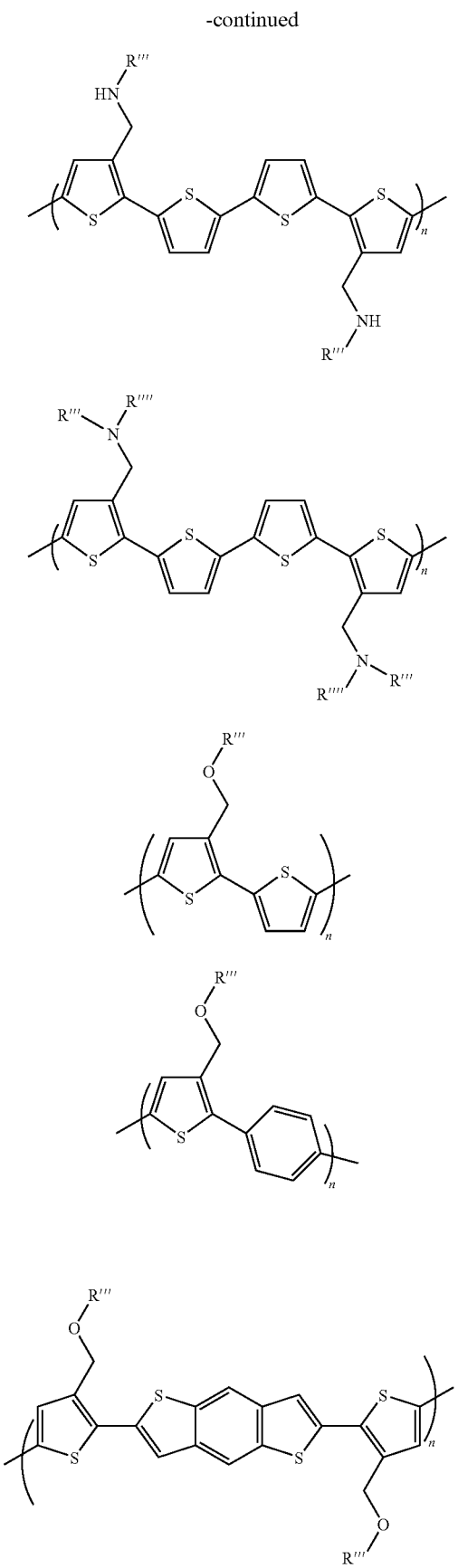

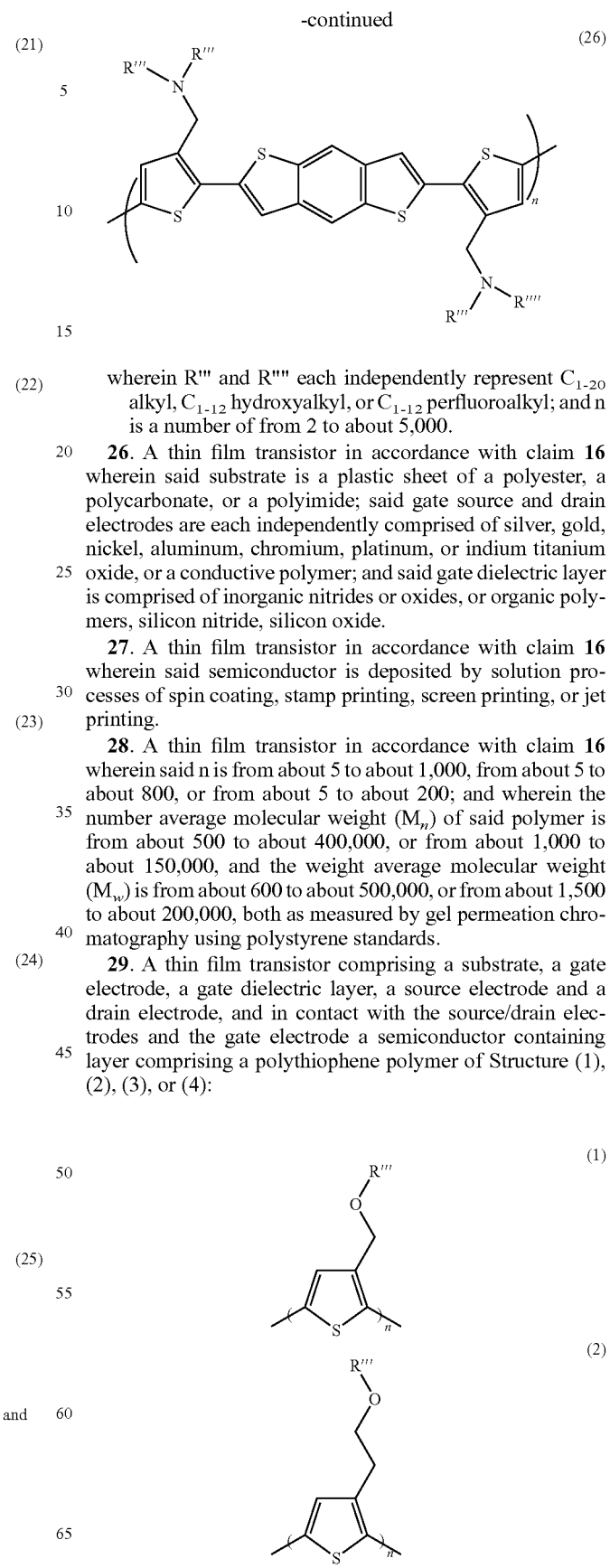

wherein R''' and R'''' each independently represent C$_{1-20}$ alkyl, C$_{1-12}$ hydroxyalkyl, or C$_{1-12}$ perfluoroalkyl; and n is a number of from 2 to about 5,000.

26. A thin film transistor in accordance with claim 16 wherein said substrate is a plastic sheet of a polyester, a polycarbonate, or a polyimide; said gate source and drain electrodes are each independently comprised of silver, gold, nickel, aluminum, chromium, platinum, or indium titanium oxide, or a conductive polymer; and said gate dielectric layer is comprised of inorganic nitrides or oxides, or organic polymers, silicon nitride, silicon oxide.

27. A thin film transistor in accordance with claim 16 wherein said semiconductor is deposited by solution processes of spin coating, stamp printing, screen printing, or jet printing.

28. A thin film transistor in accordance with claim 16 wherein said n is from about 5 to about 1,000, from about 5 to about 800, or from about 5 to about 200; and wherein the number average molecular weight (M$_n$) of said polymer is from about 500 to about 400,000, or from about 1,000 to about 150,000, and the weight average molecular weight (M$_w$) is from about 600 to about 500,000, or from about 1,500 to about 200,000, both as measured by gel permeation chromatography using polystyrene standards.

29. A thin film transistor comprising a substrate, a gate electrode, a gate dielectric layer, a source electrode and a drain electrode, and in contact with the source/drain electrodes and the gate electrode a semiconductor containing layer comprising a polythiophene polymer of Structure (1), (2), (3), or (4):

-continued

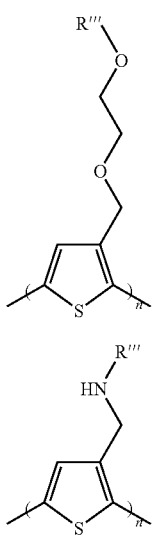

(3)

(4)

wherein R''' is $C_{1-20}$ alkyl, $C_{1-12}$ hydroxyalkyl, $C_{1-8}$ methoxyalkyl, or $C_{1-12}$ perfluoroalkyl; and wherein said n is a number of from about 5 to about 1,000.

30. A thin film transistor in accordance with claim 29 wherein said n is a number of from about 5 to about 2,500, from about 5 to about 1,000, from about 5 to about 800, or from about 5 to about 200; the polythiophene number average molecular weight ($M_n$) is from about 500 to about 400,000, or from about 1,000 to about 150,000; and the weight average molecular weight ($M_w$) of the polythiophene is from about 600 to about 500,000, or from about 1,500 to about 200,000, both as measured by gel permeation chromatography using polystyrene standards.

* * * * *